United States Patent [19]
Theus

[11] Patent Number: 5,654,629
[45] Date of Patent: Aug. 5, 1997

[54] CURRENT MIRROR IN MOS TECHNOLOGY COMPRISING CASCADE STAGES WITH WIDE DRIVE RANGES

[75] Inventor: Ulrich Theus, Gundelfingen, Germany

[73] Assignee: Deutsche ITT Industries GmbH, Freiburg, Germany

[21] Appl. No.: 608,146

[22] Filed: Feb. 28, 1996

[30] Foreign Application Priority Data

Mar. 1, 1995 [DE] Germany ............. 195 07 155.7

[51] Int. Cl.$^6$ ........................... G05F 3/16
[52] U.S. Cl. ............. 323/316; 323/315; 327/66
[58] Field of Search ................ 323/314–316; 327/73, 82, 85, 66

[56] References Cited

U.S. PATENT DOCUMENTS 5,387,882  2/1995  Schoofs .................... 331/111

FOREIGN PATENT DOCUMENTS 4201155  1/1993  Germany.

*Primary Examiner*—Peter S. Wong
*Assistant Examiner*—Shawn Riley
*Attorney, Agent, or Firm*—Plevy & Associates

[57] ABSTRACT

A current mirror circuit including at least one current bank transistor coupled to a cascade transistor. The cascade transistor further coupled to a current mirror input. A current-controlled current source operable for both receiving a differential current from said current mirror input and for producing a charging current for charging a gate of the at least one current bank transistor in order to null the differential current.

20 Claims, 2 Drawing Sheets

CURRENT MIRROR IN MOS TECHNOLOGY COMPRISING CASCADE STAGES WITH WIDE DRIVE RANGES

BACKGROUND OF THE INVENTION

The present invention relates generally to an electrical circuit and more particularly, to a current mirror circuit that includes a current-controlled current source for control purposes that provides improved performance and stability.

DESCRIPTION OF THE PRIOR ART

In monolithic integrated circuits, particularly in analog stages, current mirrors with equal or different current transfer ratios and with one or more current outputs are used for a multitude of auxiliary functions. These functions require the output characteristics of the current mirrors to be as voltage-independent as possible. The voltage independence is accomplished by making the current-mirror outputs as high-impedance as possible, designing the individual current-mirror outputs as cascade stages or generating the fixed potential for the control electrodes of the cascade transistors by means of an auxiliary voltage source.

A very simple and frequently used current mirror with cascade stages in MOS technology is shown in FIG. 1. One disadvantage of this circuit is that under specific operation- and technology-dependent conditions, saturation of a number of transistors is not ensured. The saturation region of n-channel or p-channel transistors is defined by the known saturation equations:

$$V_{DS} \geq (V_{GS} - V_T) \text{ for n-channel transistors} \quad (1)$$

$$V_{DS} \leq (V_{GS} - V_T) \text{ for p-channel transistors} \quad (2)$$

The main cause of the critical operating condition of the n-channel current mirror 10 is the gate potential of the common n-channel current bank control line 22, which is connected directly to the current-mirror input em. Since this terminal is also connected to the series combination of the two drain-source current paths of the cascaded current-mirror input 12,18, it is readily apparent that the gate potential of the current-bank transistor 12, hereinafter also referred to as the "current mirror control transistor", is higher than its drain potential by the value of the drain-to-source voltage of the cascade transistor 18. Since both transistors 12,18 are operated in the saturation region, it follows from saturation equations (1),(2) that:

$$V_{DS2} < V_{Th1}, \quad (3)$$

,where $V_{DS2}$ is the drain-tp-source voltage of the cascade transistor 18, and $V_{Th1}$ is the threshold voltage of the current-bank transistor 12.

The magnitude of the threshold voltage $V_T$ is determined by the technology used. Unfortunately its negative temperature coefficient runs counter to the positive temperature coefficient of the effective gate voltage for the same current, but with increasing chip temperature.

A remedy for the above problem is provided by another known circuit 24 shown in FIG. 2, in which the gate electrode of the current mirror control transistor 12 is controlled by a control circuit 28, which has an input that is supplied with a signal taken from the current-mirror input em. To this end, the input-current path of the actual current mirror 26 is opened electronically. Thus, a differential current id is formed from the applied current mirror input current ie and the output current i1 of the current mirror control transistor 12.

When the differential current id becomes zero, the applied input current ie is equal to the output current i1 of the current mirror control transistor 12, so that the desired value of the control process has been reached. As a result, the drive voltage for the gate terminal of the current mirror control transistor 12, and hence the potential of the common current bank control line 22, automatically adjusts itself to an uncritical value. A look at the resulting potential conditions shows that the potential of the common current bank control line 22 can be substantially lower than the potential of the auxiliary voltage source, so that the desired saturation state is ensured for the current mirror control transistor 12 and for the cascade stages 16,18 of the current mirror 26.

A disadvantage of the circuit shown in FIG. 2 which contains a negative-feedback operational amplifier 30 as the control circuit is its critical stability behavior, which may result in oscillations unless suitable attenuation is provided. On the other hand, conventional attenuation measures affect the frequency response of the current mirror 26, so that the latter becomes too slow for many signal applications. In addition, the circuit requires at least one additional capacitor 36 for stabilization, which is particularly disadvantageous if the circuit 24 is implemented using monolithic integrated circuit technology.

It is therefore, an object of the present invention to provide a current mirror that is capable of being driven for a wide range of frequencies without the use of capacitors for stability purposes.

SUMMARY OF THE INVENTION

A current mirror circuit including at least one current bank transistor coupled to a cascade transistor. The cascade transistor further coupled to a current mirror input. A current-controlled current source operable for both receiving a differential current from said current mirror input and for producing a charging current for charging a gate of the at least one current bank transistor in order to null the differential current.

BRIEF DESCRIPTION OF THE DRAWING

The above objects, further features and advantages of the present invention are described in detail below in conjunction with the drawings, of which.

DETAILED DESCRIPTION OF THE DRAWING

Figure 1:
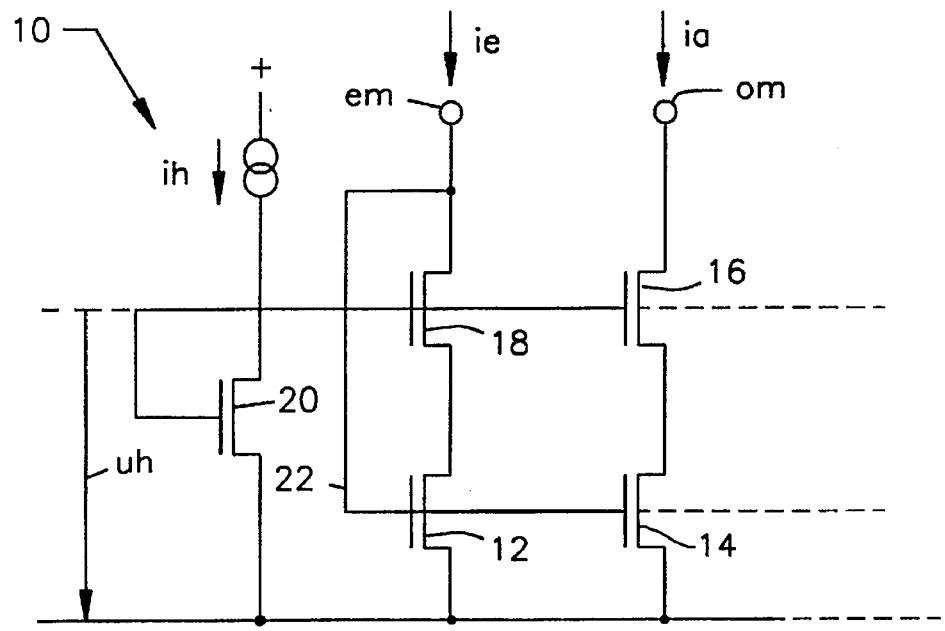
FIG. 1 is a schematic diagram of a prior art current mirror.

Referring to FIG. 1, there is shown a schematic diagram of a prior art current mirror circuit. The current mirror 10 causes an input current ie, which is generated by a source not shown, to be mirrored as an output current ia at an n-channel current bank including transistors 12,14. To decouple the output current ia from the respective output voltage, a cascade transistor 16 is connected between the current-mirror output om and the drain electrode of current bank transistor 14. For reasons of symmetry, the input current ie is also passed through another cascade transistor 18 connected between the current-mirror input em and the drain terminal of the current-bank transistor 12, which also services as a current mirror control transistor.

The common gate potential of the cascade transistors 16,18 is tied to an auxiliary voltage uh which is formed by means of an auxiliary current ih and a diode-connected n-channel transistor 20. A common current bank control line 22 of the current bank is connected to the drain electrode of the cascade transistor 18. It is readily apparent that under certain operating conditions, because of the two series-connected n-channel transistor 12,18, the drain potential of the current-bank transistor 12 becomes too small compared with the gate potential, so that the transistors 12,18 are no longer saturated and, consequently, the current balance between the current-bank transistors 12,14 is upset.

Figure 2:
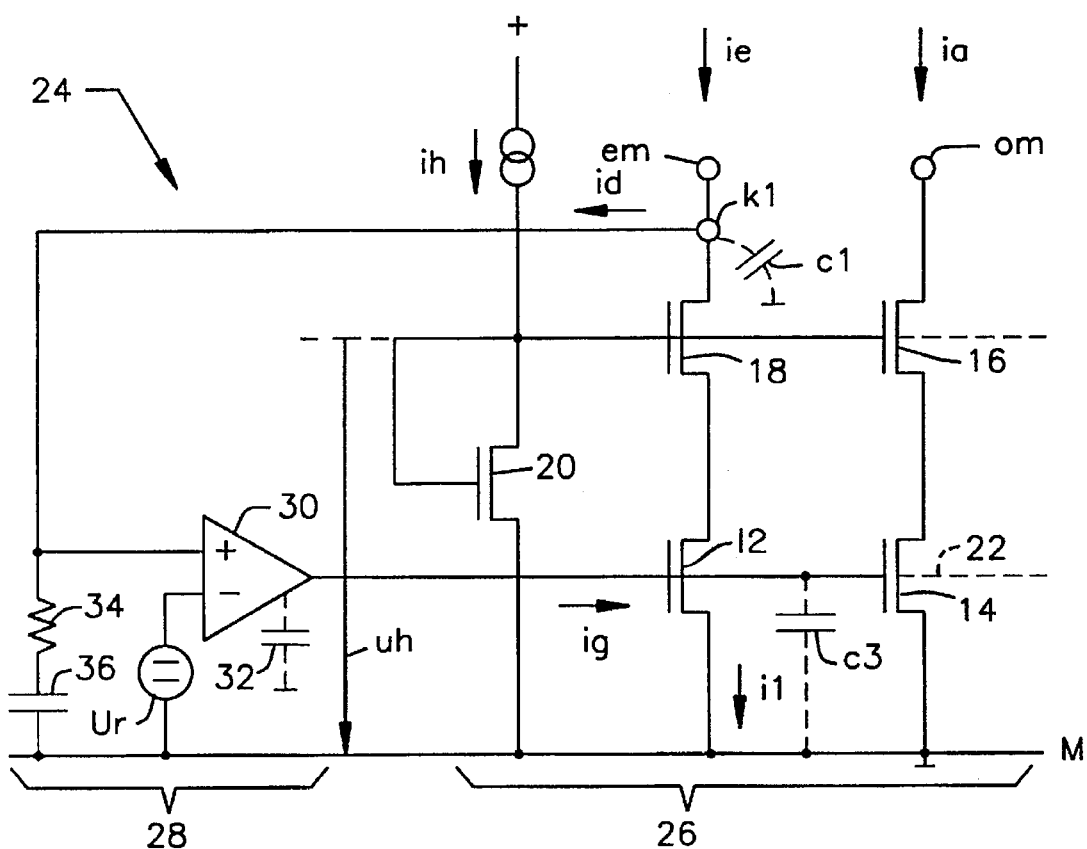
FIG. 2 is a schematic diagram of another prior art current mirror.

Referring to FIG. 2, a schematic diagram of another prior art current mirror is shown. The current mirror 24 is an improvement over the current mirror 10 of FIG. 1, in that the relatively high gate potential of the current-bank transistor 12, has been eliminated by providing a control circuit 28 for controlling the common current bank control line 22 in the actual current mirror 26.

The auxiliary voltage uh for the two cascade transistors 16,18 is identical with the implementation of FIG. 1. More complex circuits for stabilizing the auxiliary voltage uh are known in the art but have nothing to do with the invention.

In the prior art current bank control circuit 28 of FIG. 2, the common current bank control line 22 is connected to the output of an operational amplifier 30. The non-inverting input of the op amp 30 is coupled to the current-mirror input em, while the inverting input is tied to a reference voltage Ur. The non-inverting input is connected to the common ground line M through an RC section 34,36.

The magnitude of the drain-source current i1, which is controlled by the current bank control transistor 12 and also flows through the cascade transistor 18, depends on the output voltage of the operational amplifier 30. By contrast, the current-mirror input em is supplied with the time-varying input current ie from a source not shown. If the two currents ie and i1 are unequal, this results in a differential current id which is available from a first node k1 or is injected at this node. It is assumed that the output voltage of the operational amplifier 30 utilized is independent of the common-mode voltage at the two operational-amplifier inputs, as is usual with such amplifiers. Thus, the control voltage for the current bank control line 22 is independent of the voltage at the current-mirror input em. Through this de-coupling, the voltage at the current-mirror input em can also be higher than the voltage of the current bank control line 22.

The RC section 34,36 is necessary to assure stability of the circuit. Through the control action, the drain-source current i1 changes and adapts to the input current ie. The goal of the control process has been reached when no differential current id flows, so that the current bank control line 22 is at its correct potential. The output current ia of the current bank 12,14 and thus the output current of the actual current mirror 26 is varied proportionally with the magnitude of the current i1, of course.

As stated above, the circuit of FIG. 2 is very complicated and costly, its behavior being satisfactory for steady-state or slowly varying input current ie. If, however, the input currents ie change rapidly and the output currents ia are to follow these changes, the time response of the closed loop must be considered.

A critical factor is the distribution of the poles and zeros of the closed loop in the complex frequency plane, which are linked to the capacitances c1, c2, c3. The first node k1 is, for example, a high-impedance output and forms a first pole together with the associated parasitic capacitance c1. A second pole is formed by the negative-feedback operational amplifier op 30 and the RC section 34,36, wherein the negative-frequency feedback of the operational amplifier 30 is indicated schematically by the capacitor c2.

In the normal frequency range of the operational amplifier 30, its output signal differs in phase from its input signal by 90°. The gate capacitances c3 of the current-bank transistors 12,14 and associated parasitic capacitances represent a third pole, which becomes effective in connection with the output resistance of the operational amplifier 30. The three times constants of the poles cause a phase shift which can easily set the closed loop into oscillation. This is particularly critical if the resulting zeros/poles for the closed loop are closely spaced in frequency and the loop gain there is still large enough.

As a remedy, either the loop gain is reduced or a dominant pole is produced by increasing the capacitance c3, or a pole is partially compensated for by a zero for such as the RC section 34,36 of FIG. 2. However, all these measures adversely affect the control behavior, because the control rate is slowed down.

Figure 3:
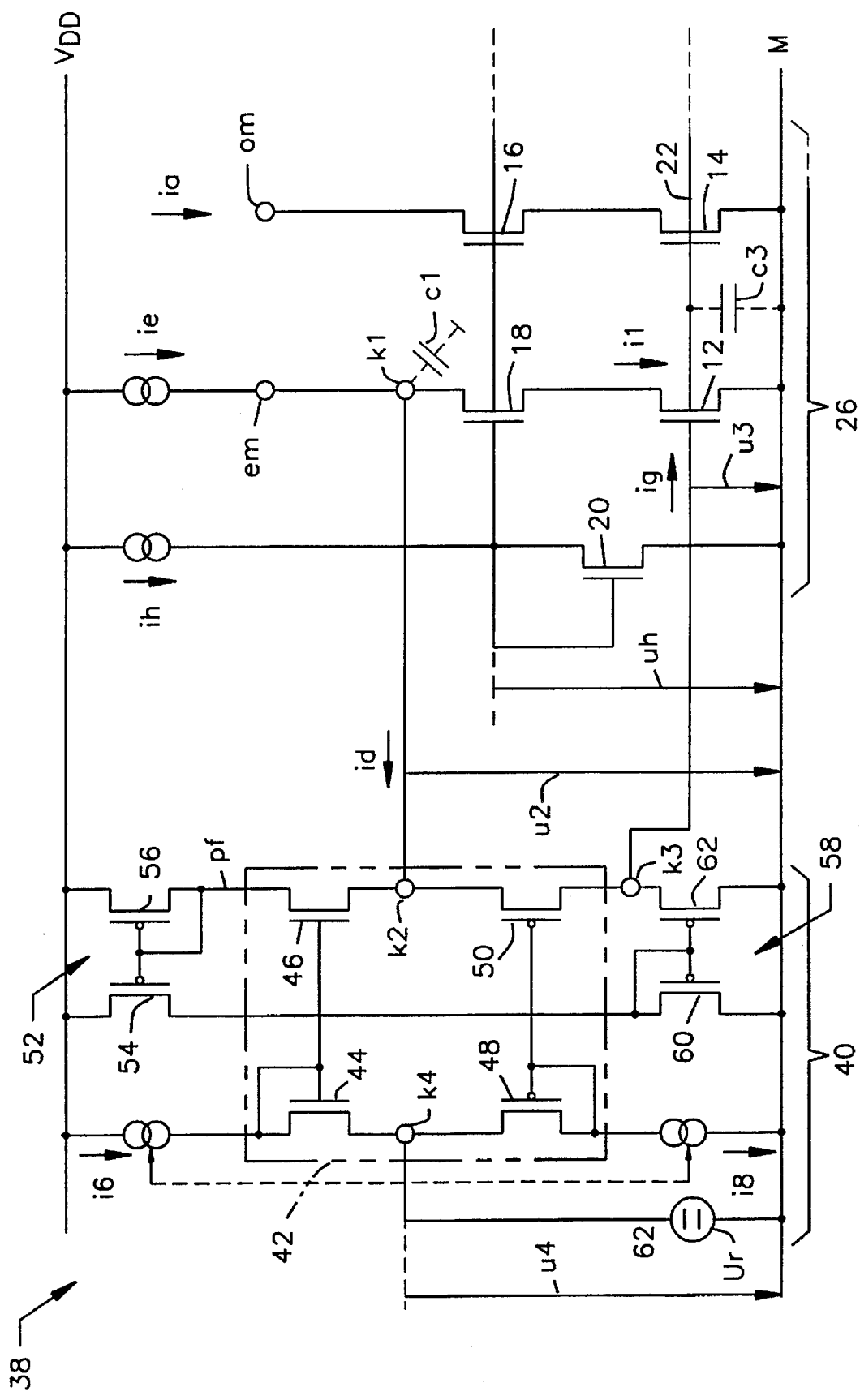
FIG. 3 is a schematic diagram of a current mirror according to the present invention.

Referring to FIG. 3, there is shown a schematic diagram of a current mirror circuit according to the present invention. The current mirror circuit 38 has an input-current path which is also opened, which causes a differential current id to be formed from the applied input current ie and the current i1 of the current bank transistor 12. This controls the potential of the current bank control line 22 via a control circuit 40.

In the present invention, the control circuit is a current-controlled current source 40 having a control input k2 connected to the differential-current tap in the current-mirror input k1 and a control output k3 coupled to the common current bank control line 22.

The use of a current source 40 as the control circuit has the advantage that the capacitive load of the common current bank control line 22 which may vary widely according to the size and number of gate electrodes connected represents the dominant pole of the entire control circuit 40 and, therefore, essentially determines the behavior of the closed loop. While the other poles of the circuit have less influence. Because of the capacitive load of the common current bank control line, there is generally no need for an additional internal or external capacitor.

The stability behavior also depends on the loop gain, and thus on the current transfer ratio of the current-controlled current source 40. It is therefore advantage if the current transfer ratio does not exceed the value 10, a preferred value being approximately unity, so that the input and output currents are approximately equal in magnitude. The current transfer ratio can be easily set via the W/L ratio of the transistors coupled to the current source and current bank.

The current-controlled current source 40 has a low-impedance control input k2 which is fed with the differential current id. The current source 40 further has a high-impedance output, the node k3, which is connected directly to the current bank control line 22. The use of a current source 40 to drive the current-bank transistors 12,14 is an essential aspect of the invention, because, as a rule, MOS transistors are assumed to be voltage-controlled rather than current-controlled, so that low-impedance drive should be provided for them, particularly if recharging is to be very fast.

In the current bank 12,14, the output current of the current source 40 serves as a gate charging current ig for the gate capacitances c3, which causes the current bank 12, 14 to follow the variations in the input current ie. Through the gate recharging current ig, the drive potential u3 for the current-bank transistor 12,14 is changed. When the goal of the control process has been reached, i.e., when the input current ie is equal to the current-bank current i1, the differential current id taken from the first node k1 has become zero, whereby the output current ig of the current source q also becomes zero. The gate drive potential u3 has then reached its desired value-the control process is complete.

The above-described operation of the control process shows that both the differential current id and the gate recharging current ig must not be unidirectional, but bi-directional which means these currents must be able to flow in a positive or negative direction. This is achieved by the implementation of the current source 40 in FIG. 3. The circuit 40, implemented in CMOS technology, is very advantageous since its power drain is low because of the small number of shunt-current paths. In particular, a four-transistor cell 44,46,48,50 fits as a voltage follower 42 into the current source 40 in such a manner that all four transistors perform a dual function.

The voltage follower 42 serves to fix the potential of the input em of the actual current mirror 26. This is achieved by the connection between the voltage-follower input k4 and a reference-voltage source Ur having a potential u4. The potential u4 is transmitted to the control output k2 of the voltage follower 42. Through the symmetrical design of the four-transistor cell including n-channel transistors 44,46 and p-channel transistors 48,50, positive or negative currents are available from the output k2 of the voltage follower 42.

Since the output k2 of the voltage follower 42 is also the control input of the current source 40, the differential current id fed into the node k2 is mirrored back into the shunt current path pf with the node k2 via two interacting complementary current mirrors 52,58. The differential current id fed into the node k2 upsets the predetermined current balance of the feedback current mirror 52,58 and generates a differential current, which is available from the node k3 as the gate recharging current ig. The high-impedance tap k3 is formed by the junction point of the drain terminals of an n-channel transistor 62 and the p-channel transistor 50. The n-channel transistor 62 is the output transistor of the n-channel current mirror 58, and the transistor 50 is the p-channel output transistor of the four-transistor cell. The node k3 thus represents the output of the current source 40. To make it easier to describe the operation of the actual current mirror 26 and the current source 40 in separate form, the common junction point K1, k2 is represented in FIG. 3 and in the description as separate nodes K1, k2.

The potential u4 of the reference-voltage source Ur, as described, determines the level u2 of the current-mirror input em. By suitable choice of the auxiliary voltage uh, the gate drive potential for the cascade stages 16,18 can be set lower than the current mirror input voltage u2 in a simple manner. The output voltage u3 of the current source 40, except for the saturation voltages of the transistors 50,62, corresponds to the entire range of the voltage u2.

The quiescent current of the two interacting current mirrors 52,58 is set by the current-source current i6, i8 in the input portion of the voltage follower 42. Internal linking between the two current sources makes the current i6 and i8 equal in magnitude. Since the potentials of the nodes k2 and k4 are equal, the n-channel transistors 44,46 and the p-channel transistors 48,50 are regarded as respective current mirrors which mirror the current-source current i6 and the current i8 of the same magnitude to the respective output. These currents are superposed with the differential current id, which is applied to the node k3 through the current mirrors 52,58 in one direction and through the transistor 50 in the other direction. If each of the current mirrors 52,58 has a current transfer ratio of 1:1, the available output current ig will be identical with the applied differential current id.

It is also possible to implement more complex current-source circuits which have a current transfer ratio other than unity, e.g., between 0.1 and 10. This affects the recharging of the current-bank transistors 12,14 but also changes the stability margin. The latter, however, is very large in the circuit arrangement of FIG. 3, since the dominant time constant is formed by the gate capacitance c3 of the current bank control line 22 in conjunction with the high-impedance node k3. The parasitic capacitance c1, which is coupled to the node K1, sees only the low-impedance output k2 of the voltage follower 42.

The schematic representation of the auxiliary-voltage source 20, the reference-voltage source Ur, and the current sources for the currents, i6, i8 in FIG. 3 does not preclude known measures to improve the respective circuit function, such as the use of band-gap circuits for generating stable voltages or currents. Furthermore, FIG. 3 only shows a single output-current path of the actual current mirror 26 for the current ie. Further current outputs, also with arbitrary current transfer ratios, are not shown to simplify the illustration. In the embodiment of FIG. 3, the current-controlled current source 40 contains CMOS transistors. However, a current-controlled current source can also be implemented utilizing n-channel technology or p-channel technology, of course.

While the invention has been particularly shown and described with reference to preferred embodiments thereof, it will be understood by those skilled in the art that changes in form and details may be made therein without departing from the spirit and scope of the present invention.

What is claimed is:

1. A current mirror circuit including current bank transistors having commonly coupled gates forming a control line, a cascade transistor having a wide control range coupled to each of said current bank transistors and a current mirror input coupled to one of said cascade transistors, the improvement therewith comprising:

a current-controlled current source having a control input coupled to said current mirror input and a control output coupled to said control line, said current source operable to produce a potential at said control output in response to a differential current developed at said control input, said potential for charging said control line in order to eliminate said differential current.

2. The circuit of claim 1, wherein between said control input and control output said circuit has a current transfer ratio between 0.1 and 10.

3. The circuit of claim 2, wherein said transfer ratio is approximately 1.

4. The circuit of claim 1, wherein said current source includes two complimentary current mirrors.

5. The circuit of claim 4, wherein said current source further includes a voltage follower coupled between said two complimentary current mirrors.

6. The circuit of claim 5, wherein said voltage follower includes four transistors paired together in terms of each said transistors electrical characteristics.

7. The circuit of claim 5, wherein said voltage follower includes a pair of complimentary transistors having commonly coupled source terminals, said commonly coupled source terminals forming said control input of said current source.

8. The circuit of claim 7, wherein said voltage follower further includes a second pair of complimentary transistors that couple said first pair of complimentary transistors to a reference potential for maintaining said current mirror input at a constant potential.

9. The circuit of claim 8, wherein said current bank transistors, cascade transistors, said first pair of complimentary transistors and second pair of complimentary transistors are MOSFETs.

10. The circuit of claim 1, wherein said control line has a capacitance that forms the dominant time constant of said circuit.

11. A current mirror circuit including at least one cascade transistor coupled to a current bank transistor and a current mirror input coupled to said cascade transistor, the improvement therewith comprising:

a current-controlled current source having a control input coupled to said current mirror input and a control output coupled to a gate of said current bank transistor, said current source operable to produce a potential at said control output in response to a differential current developed at said control input, said potential for charging said gate in order to null said differential current.

12. The circuit of claim 11, wherein between said control input and control output said circuit has a current transfer ratio between 0.1 and 10.

13. The circuit of claim 12, wherein said transfer ratio is approximately 1.

14. The circuit of claim 11, wherein said current source includes two complimentary current mirrors.

15. The circuit of claim 14, wherein said current source further includes a voltage follower coupled between said two complimentary current mirrors.

16. The circuit of claim 15, wherein said voltage follower includes a pair of complimentary transistors having commonly coupled source terminals, said commonly coupled source terminals forming said control input of said current source.

17. The circuit of claim 16, wherein said voltage follower further includes a second pair of complimentary transistors that couple said first pair of complimentary transistors to a reference potential for maintaining said current mirror input at a constant potential.

18. The circuit of claim 17, wherein said current bank transistor, at least one cascade transistor, said first pair of complimentary transistors and second pair of complimentary transistors are MOSFETs.

19. A current mirror circuit comprising:

at least one current bank transistor having a gate forming a control line;

a cascade transistor coupled to said at least one current bank transistor and having a current mirror input;

a current-controlled current source coupled between said control line and said current mirror input, said current-controlled current source operable for receiving a differential current from said current mirror input and then producing a charging current for charging said control line in order to null said differential current.

20. The circuit of claim 19, wherein said differential current and charging current is bi-directional.

* * * * *